United States Patent
Song et al.

(10) Patent No.: US 9,337,100 B2
(45) Date of Patent: May 10, 2016

(54) APPARATUS AND METHOD TO FABRICATE AN ELECTRONIC DEVICE

(75) Inventors: Seung-Chul Song, Austin, TX (US);
Beom-Mo Han, San Diego, CA (US);
Mohamed Hassan Abu-Rahma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 111 days.

(21) Appl. No.: 12/477,412

(22) Filed: Jun. 3, 2009

(65) Prior Publication Data
US 2010/0308408 A1    Dec. 9, 2010

(51) Int. Cl.
| | |
|---|---|
| H01L 21/77 | (2006.01) |
| H01L 21/8234 | (2006.01) |
| B82Y 10/00 | (2011.01) |
| B82Y 40/00 | (2011.01) |
| H01L 21/3213 | (2006.01) |
| H01L 29/66 | (2006.01) |
| H01L 29/78 | (2006.01) |
| G03F 7/00 | (2006.01) |

(52) U.S. Cl.
CPC ......... *H01L 21/823431* (2013.01); *B82Y 10/00* (2013.01); *B82Y 40/00* (2013.01); *H01L 21/32139* (2013.01); *H01L 29/66795* (2013.01); *H01L 29/785* (2013.01); *G03F 7/0002* (2013.01); *Y10T 29/41* (2015.01); *Y10T 428/24479* (2015.01)

(58) Field of Classification Search
None
See application file for complete search history.

(56) References Cited

U.S. PATENT DOCUMENTS

| | | | |
|---|---|---|---|
| 6,190,929 B1 * | 2/2001 | Wang et al. | 438/20 |
| 7,180,134 B2 * | 2/2007 | Yang et al. | 257/347 |
| 2002/0163513 A1 * | 11/2002 | Tsuji | 345/204 |
| 2003/0138704 A1 | 7/2003 | Mei et al. | |
| 2004/0259295 A1 * | 12/2004 | Tomiye et al. | 438/155 |
| 2004/0266076 A1 * | 12/2004 | Doris et al. | 438/157 |
| 2004/0266088 A1 * | 12/2004 | Luyken et al. | 438/202 |
| 2005/0224452 A1 * | 10/2005 | Spiess et al. | 216/41 |
| 2005/0239252 A1 | 10/2005 | Ahn et al. | |
| 2005/0242391 A1 * | 11/2005 | She et al. | 257/324 |
| 2005/0266693 A1 * | 12/2005 | Maekawa | 438/720 |
| 2006/0157788 A1 * | 7/2006 | Joshi et al. | 257/351 |
| 2007/0001232 A1 | 1/2007 | King et al. | |

(Continued)

FOREIGN PATENT DOCUMENTS

| | | |
|---|---|---|
| CN | 1726433 A | 1/2006 |
| CN | 101292346 A | 10/2008 |

(Continued)

OTHER PUBLICATIONS

International Search Report and Written Opinion—PCT/US2010/037241, International Searching Authority—European Patent Office, Nov. 5, 2010.

(Continued)

*Primary Examiner* — Fei Fei Yeung Lopez
(74) *Attorney, Agent, or Firm* — Donald D. Min; Paul Holdaway

(57) ABSTRACT

An apparatus and method to fabricate an electronic device is disclosed. In a particular embodiment, an apparatus includes a template having an imprint surface. The imprint surface includes a first region having a first pattern adapted to fabricate a fin field effect transistor (FinFET) device and a second region having a second pattern adapted to fabricate a planar electronic device.

15 Claims, 5 Drawing Sheets

(56) References Cited

U.S. PATENT DOCUMENTS

| | | | |
|---|---|---|---|
| 2007/0069293 A1 | 3/2007 | Kavalieros et al. | |
| 2007/0104813 A1* | 5/2007 | Wuister et al. | 425/174.4 |
| 2007/0257389 A1 | 11/2007 | Ruf | |
| 2007/0261016 A1 | 11/2007 | Sandhu et al. | |
| 2008/0265338 A1* | 10/2008 | Yu et al. | 257/397 |
| 2009/0166770 A1 | 7/2009 | Gluschenkov et al. | |
| 2010/0165767 A1* | 7/2010 | Lin et al. | 365/203 |

FOREIGN PATENT DOCUMENTS

| | | |
|---|---|---|
| DE | 102006019962 | 11/2007 |
| EP | 1331516 | 7/2003 |
| EP | 1387216 A2 | 2/2004 |
| JP | 2003249444 A | 9/2003 |
| JP | 2004071587 A | 3/2004 |
| JP | 2005527110 A | 9/2005 |
| JP | 2006080519 A | 3/2006 |
| JP | 2009006619 A | 1/2009 |
| JP | 2012501084 A | 1/2012 |
| WO | 2004044654 A2 | 5/2004 |
| WO | 2008047447 A1 | 4/2008 |

OTHER PUBLICATIONS

Taiwan Search Report—TW099118089—TIPO—May 29, 2013.
Yaghmaie F., et al., "A Simplified Method to Produce a Functional Test Stamp for Nanoimprint Lithography (NIL)", IEEE Sensors Journal, Mar. 2009, vol. 9 (3), pp. 233-234.

* cited by examiner

APPARATUS AND METHOD TO FABRICATE AN ELECTRONIC DEVICE

I. FIELD

The present disclosure relates generally to devices integrating fin-type field effect transistors (FinFETs) and planar electronic devices on a common substrate and methods of forming such devices.

II. DESCRIPTION OF RELATED ART

Advances in technology have resulted in smaller and more powerful personal computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. However, power consumption of such portable devices can quickly deplete a battery and diminish a user's experience.

Reducing power consumption has led to smaller circuitry feature sizes and operating voltages within such portable devices. Reduction of feature size and operating voltages, while reducing power consumption, also increases sensitivity to noise and to manufacturing process variations. Fin-type field effect transistors (FinFETs) are low-power, high speed transistors that can be densely packed on a substrate. Unfortunately, FinFETs are not suitable for all purposes in integrated circuit designs. Different applications may involve use of different types of transistor devices.

One application may include both FinFETs and planar metal oxide semiconductor field effect transistors (MOSFETs) either on silicon on insulator (SOI) or bulk silicon substrate. However, techniques to integrate FinFETS and MOSFETs generally tend to result in large height differences between the FinFET gates and the MOSFET gates. As such, this height difference results in complex lithography and etching processes in addition to several manufacturing steps such as the use of multiple resist layers to form the FinFETs and the MOSFET devices.

III. SUMMARY

In a particular embodiment, an apparatus is disclosed. The apparatus includes a template having an imprint surface. The imprint surface includes a first region having a first pattern adapted to fabricate a fin field effect transistor (FinFET) device and a second region having a second pattern adapted to fabricate a planar electronic device.

In another particular embodiment, a method of fabricating an electronic device is disclosed. The method includes forming a patterned resist layer by applying a template to fluidic resist material supported by a substrate and forming the electronic device using the formed patterned resist layer. The template has an imprint surface that includes a first region having a first pattern adapted to fabricate a fin field effect transistor (FinFET) device, and a second region having a second pattern adapted to fabricate a planar electronic device.

In another particular embodiment, a device is disclosed. The device includes a fin field effect transistor (FinFET) device and a planar electronic device. The FinFET device and the planar electronic device are located on a monolithic substrate. The FinFET device and the planar electronic device are formed by patterning a fluidic resist material with a template having an imprint surface. The imprint surface includes a first region having a first pattern adapted to fabricate a FinFET device and a second region having a second pattern adapted to fabricate a planar electronic device.

A particular advantage provided by at least one of the disclosed embodiments is that a FinFET device and a planar electronic device can be formed on a common substrate using imprint technology without the need for additional resist layers being applied to the substrate since the FinFET device and the planar electronic device are formed at substantially the same time.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
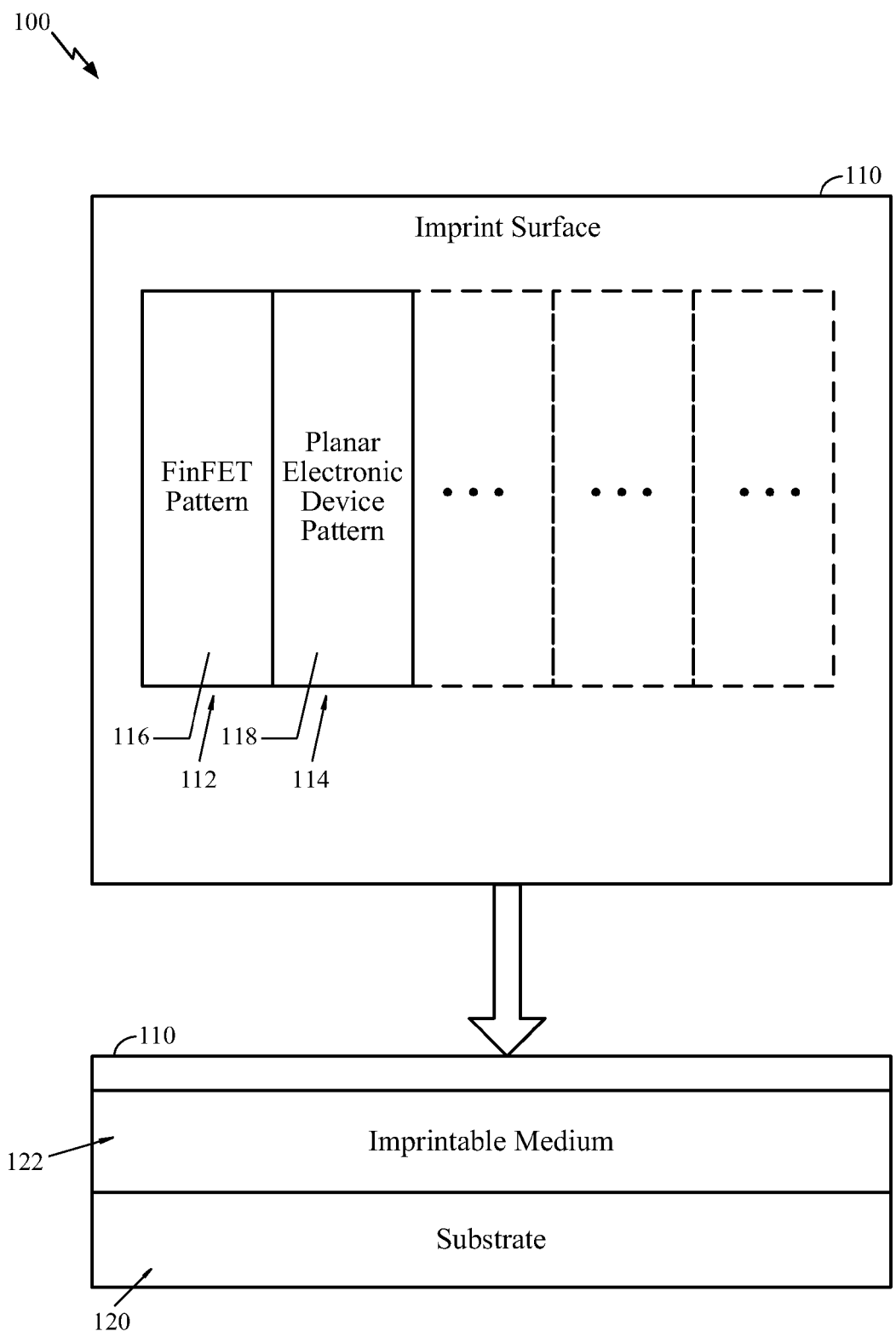
FIG. 1 is a top view of a particular illustrative embodiment of a template used in fabricating an electronic device prior to the template being pressed into an imprintable medium on a substrate.

Referring to FIG. 1, a top view of a particular illustrative embodiment of a template used in fabricating an electronic device prior to the template being pressed into an imprintable medium on a substrate is depicted and generally designated 100. A template 110 has an imprint surface representing a pattern to be formed on a substrate 120. The imprint surface includes a first region 112 and a second region 114. The first region 112 includes a first topological pattern 116 adapted to fabricate a fin field effect transistor (FinFET) device. The second region 114 includes a second topological pattern 118 adapted to fabricate a planar electronic device. In a particular embodiment, the planar electronic device is a field effect transistor (FET) or a metal oxide semiconductor field effect transistor (MOSFET).

Figure 2:
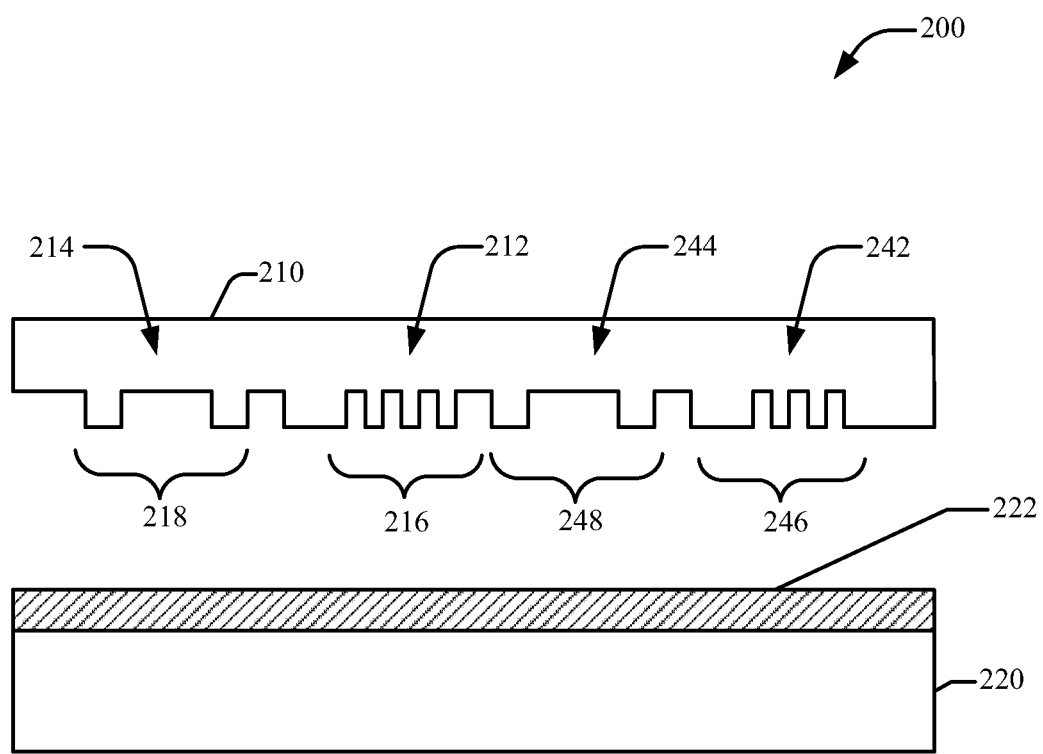
FIG. 2 is a side view of a particular illustrative embodiment of a template used in fabricating an electronic device prior to the template being pressed into an imprintable medium on a substrate.

The first topological pattern 116 and the second topological pattern 118 are transferred to an imprintable medium 122 by pressing the template 110 into the imprintable medium 122 on the substrate 120. An example of transferring such patterns into an imprintable medium is illustrated in FIG. 2. The imprintable medium 122 can, for example, be provided as a resist layer deposited on the substrate 120. In a particular embodiment, the imprintable medium 122 is a thermosetting polymer resin, a thermoplastic polymer resin or a photo-curable liquid resist. During contact with the template 110, the imprintable medium 122 flows into pattern features defined on the template 110, and the imprintable medium 122 is thereafter hardened such that a solid layer having a contour of the template pattern is formed. Thereafter, the imprinted pattern from the imprintable medium 122 may be transferred to the substrate 120 via a pattern transfer process, such as reactive ion etching or wet chemical etching. A plurality of FinFET and planar electronic device patterns can be included on the imprint surface of the template 110, thereby concurrently forming multiple FinFET and planar electronic devices on a common substrate in subsequent processing steps. In addition, the template 110 can be used to pattern a small area of the substrate 120 by imprinting the template 110 into the imprintable medium 122, curing the imprintable medium 122 beneath the template 110, removing the template 110, stepping to an adjacent region of the substrate 120, and repeating the operation, where the first pattern 116 is adapted to fabricate a plurality of FinFET devices and the second pattern 118 is adapted to fabricate a plurality of planar electronic devices, to produce multiple regions of multiple FinFET devices and planar electronic devices.

A resolution of the features on the template imprint surface may be a limiting factor on an attainable resolution of features formed on the substrate. As such, a technique capable of very high resolution may be beneficial in forming the imprint surface pattern. The template imprint surface pattern may be formed by electron beam writing. Additionally, release characteristics of the template 110 can also be a consideration, since poor template release or sticking may cause peeling or other damage to the imprinted layer resulting in the degradation of dimensional integrity of the imprinted pattern or features. The template 110 can, for example, be treated with a surface treatment material such as a lubricant coating to form a release layer on the template 110.

Referring to FIG. 2, a side view of a particular illustrative embodiment of a template 210 that may be used in fabricating an electronic device by pressing the template 210 into an imprintable medium 222 on a substrate 220 is depicted and generally designated 200. The template 210 has an imprint surface representing a pattern to be formed on the substrate 220. In an exemplary embodiment, the template 210 is a monolithic template and has an imprint surface that includes a first region 212, a second region 214, a third region 242, and a fourth region 244. The first region 212 includes a first pattern 216 adapted to fabricate a fin field effect transistor (FinFET) device. The second region 214 includes a second pattern 218 adapted to fabricate a planar electronic device, such as a FET. The third region 242 includes a third pattern 246 adapted to fabricate another FinFET device. The fourth region 244 includes a fourth pattern 248 adapted to fabricate another planar electronic device such as a second FET. The first pattern 216, the second pattern 218, the third pattern 246, and the fourth pattern 248 may be transferred to the substrate 220 by a process that includes pressing the template 210 into an imprintable medium, such as a resist layer 222 on the substrate 220. During contact with the template 210, the resist layer 222 flows into the pattern features defined on the template 210, and the resist layer 222 is thereafter hardened such that a solid layer having a contour of the template pattern is formed. Thereafter, the imprinted pattern from the resist layer 222 may be transferred to the substrate 220 via a pattern transfer process, such as reactive ion etching or wet chemical etching.

Figure 3:
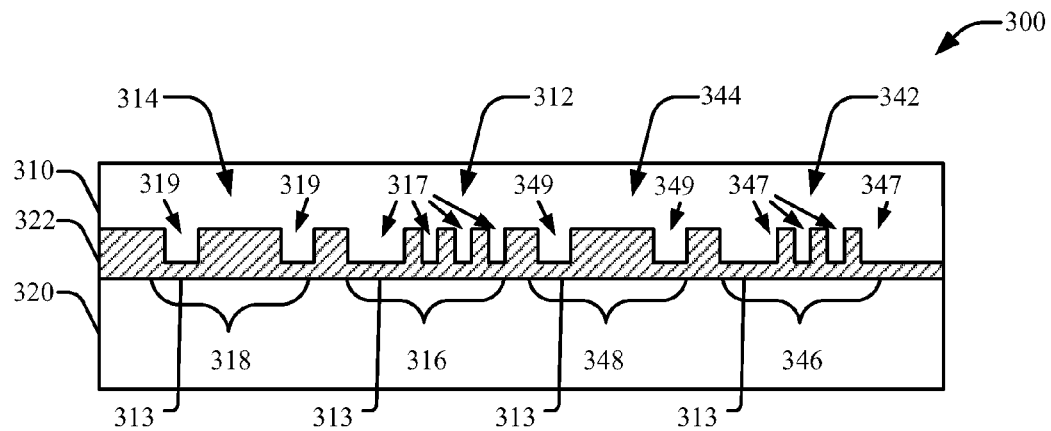
FIG. 3 is a side view of a particular illustrative embodiment of a template being pressed into an imprintable medium on a substrate.

Referring to FIG. 3, a side view of a particular illustrative embodiment of pressing a template into an imprintable medium, such as a resist layer, is depicted and generally designated 300. A template 310 has an imprint surface representing a pattern to be formed on a substrate 320. In a particular embodiment, the template 310 may be the template 210 shown in FIG. 2. The imprint surface includes a first region 312, a second region 314, a third region 342, and a fourth region 344. The first region 312 includes a first pattern 316 adapted to fabricate a fin field effect transistor (FinFET) device. The second region 314 includes a second pattern 318 adapted to fabricate a planar electronic device such as a FET. The third region 342 includes a third pattern 346 adapted to fabricate another FinFET device. The fourth region 344 includes a fourth pattern 348 adapted to fabricate another planar electronic device such as a second FET. Pillars 317 outline the first pattern, pillars 319 outline the second pattern, pillars 347 outline the third pattern, and pillars 349 outline the fourth pattern of the template 310. The first, second, third and fourth patterns may be transferred to the substrate 320 by a process that includes pressing the template 310 into an imprintable medium, such as a resist layer 322 on the substrate 320. The template 310 is pressed into the resist layer 322 so as to form compressed regions 313. In the illustrated embodiment, the pillars 317, 319, 347 and 349 are pressed into the resist layer 322 but do not contact the surface of the underlying substrate 320. At least portions of the resist layer 322 are made flowable such that the resist layer 322 contacts portions between the pillars 317, 319, 347 and 349. As a result, the resist layer 322 substantially conforms to the shape of the first pattern 316, the second pattern 318, the third pattern 346, and the fourth pattern 348 of the template 310.

Figure 4:
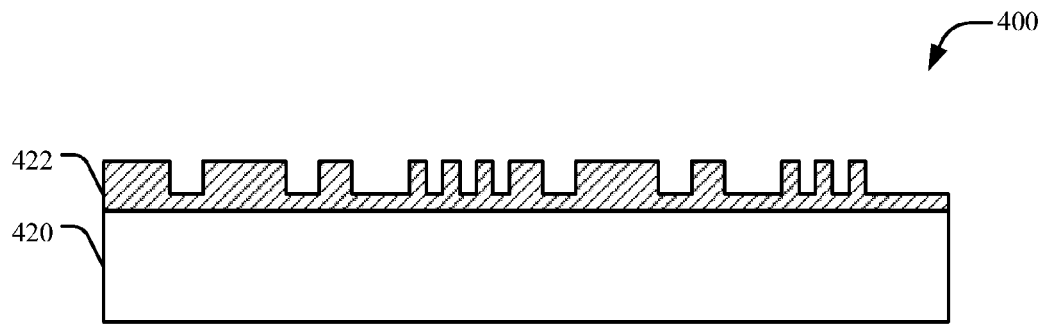
FIG. 4 is a side view of a particular illustrative embodiment of a surface contour of a solid imprinted resist layer.

Referring to FIG. 4, a side view of a particular illustrative embodiment of a surface contour of a solid imprinted resist layer 422 is depicted and generally designated 400. Resist layer 422 is formed on a substrate 420 by forming the resist layer 422 into a solid layer, and by removal of an imprinting template (not shown). In a particular embodiment, the solid imprinted resist layer 422 is contoured according to a plurality of pillars and recesses of a template which conform to the first, second, third, and fourth patterns of the illustrative template 210 depicted in FIG. 2.

Figure 5:
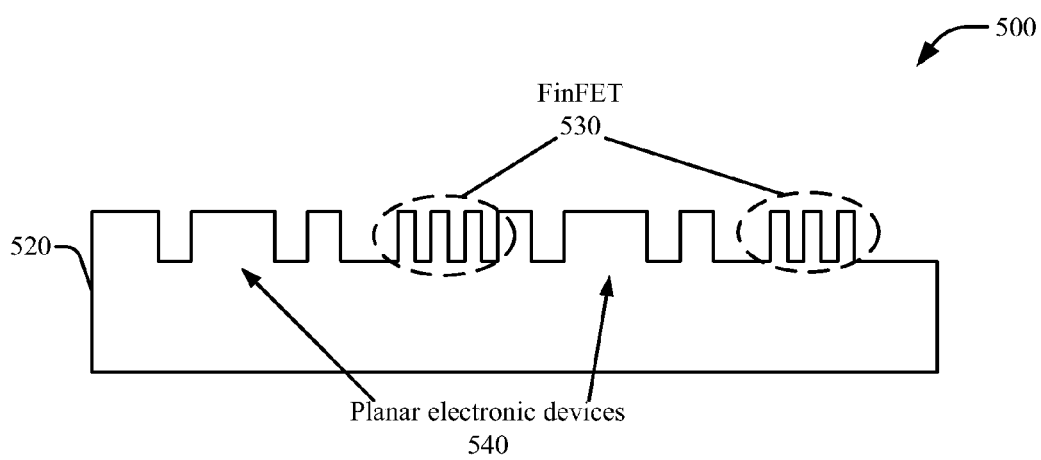
FIG. 5 is a side view of a particular illustrative embodiment of a pattern transferring a solid imprinted resist layer to a substrate.

Referring to FIG. 5, a side view of a particular illustrative embodiment of a pattern transferring a solid imprinted resist layer to a substrate is depicted and generally designated 500. A pattern transfer process, such as reactive ion etching, can be used to transfer the patterns from the solid imprinted resist layer to the substrate. In a particular embodiment, the surface contour of the solid imprinted resist layer 422 depicted in FIG. 4 is transferred to a substrate 520 via a pattern transfer process, such as reactive ion etching or wet chemical etching, thereby forming features to be used in FinFET devices 530 and planar electronic devices 540 (e.g. FET) on the substrate 520. No additional patterned resist layer need be applied to the substrate 520 to form the features to be used in the FinFET devices 530 and the planar electronic devices 540, which are formed at substantially the same time.

Figure 6:
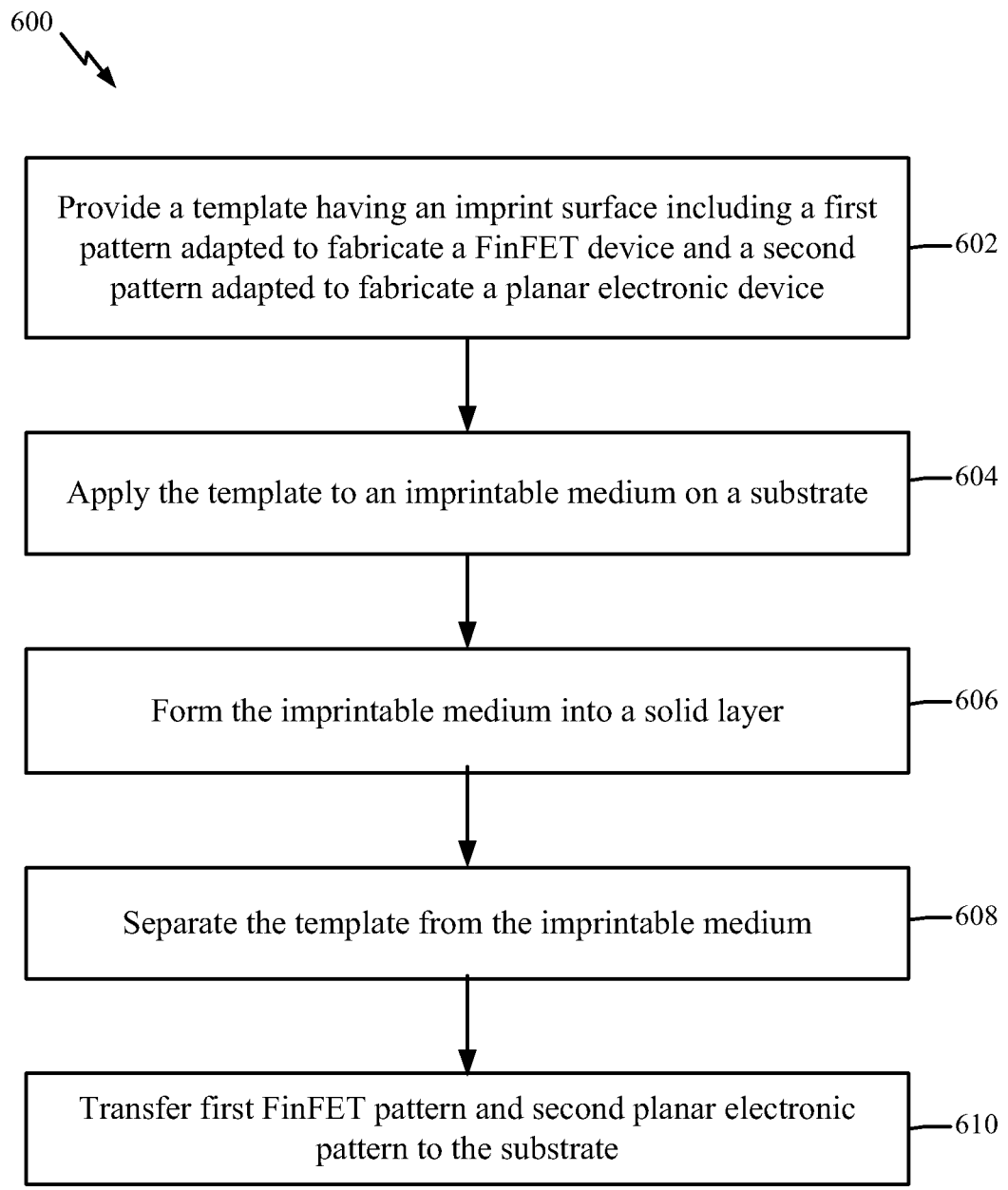
FIG. 6 is a flow chart of a particular illustrative embodiment of a method of fabricating an electronic device.

Referring to FIG. 6, a flow diagram of a particular illustrative embodiment of a method of fabricating an electronic device is depicted and generally designated 600. At 602, a template is provided where the template has an imprint surface including a first pattern adapted to fabricate a FinFET device and a second pattern adapted to fabricate a planar electronic device, such as a FET. As illustrative examples, the template may be the template 110 depicted in FIG. 1 or the template 210 depicted in FIG. 2. Moving to 604, the imprint surface patterns are transferred to an imprintable medium, such as a resist layer on a substrate, by applying the template to the imprintable medium.

Continuing to 606, the imprintable medium (e.g. resist layer) is formed into a solid layer. For example, when a thermosetting or thermoplastic polymer resin is used, the resin is heated to a temperature, such that upon contact with the template, the resin is sufficiently flowable to flow into the pattern features defined on the template. The patterned resin is then cooled. As another example, when a photo-curable liquid resist is used, the template is typically made of transparent material. In this case, after the template and resist are pressed together, the resist is cured in UV light and becomes solid.

Moving to 608, the template is separated from the imprintable medium and a solid imprinted layer including the imprinted pattern is formed on the substrate. Continuing to 610, the imprinted FinFET pattern and the planar electronic pattern is transferred from the imprinted resist layer (or other imprintable medium) to the substrate via a pattern transfer process, such as reactive ion etching or wet chemical etching, thereby forming features of a FinFET device and features of a planar electronic device (e.g. FET) on the substrate. In an exemplary embodiment, the planar electronic device may be a metal oxide semiconductor field effect transistor (MOSFET). The features of the FinFET device and the planar electronic device are formed without using additional patterned resist layers. A plurality of FinFET and planar electronic device patterns can be included on the imprint surface of the template, thereby forming multiple FinFETs and planar electronic devices.

After the formation of the FinFET device and the planar electronic device, processing occurs for formation of the remaining integrated circuit structures including interconnects, contacts, wiring layers, etc. (not shown), which are typically formed above the device level. Such processing includes the formation of insulating layers and the formation of conducting layers. The insulating layers and the conducting layers are selectively etched to form the remaining integrated circuit structures.

Figure 7:
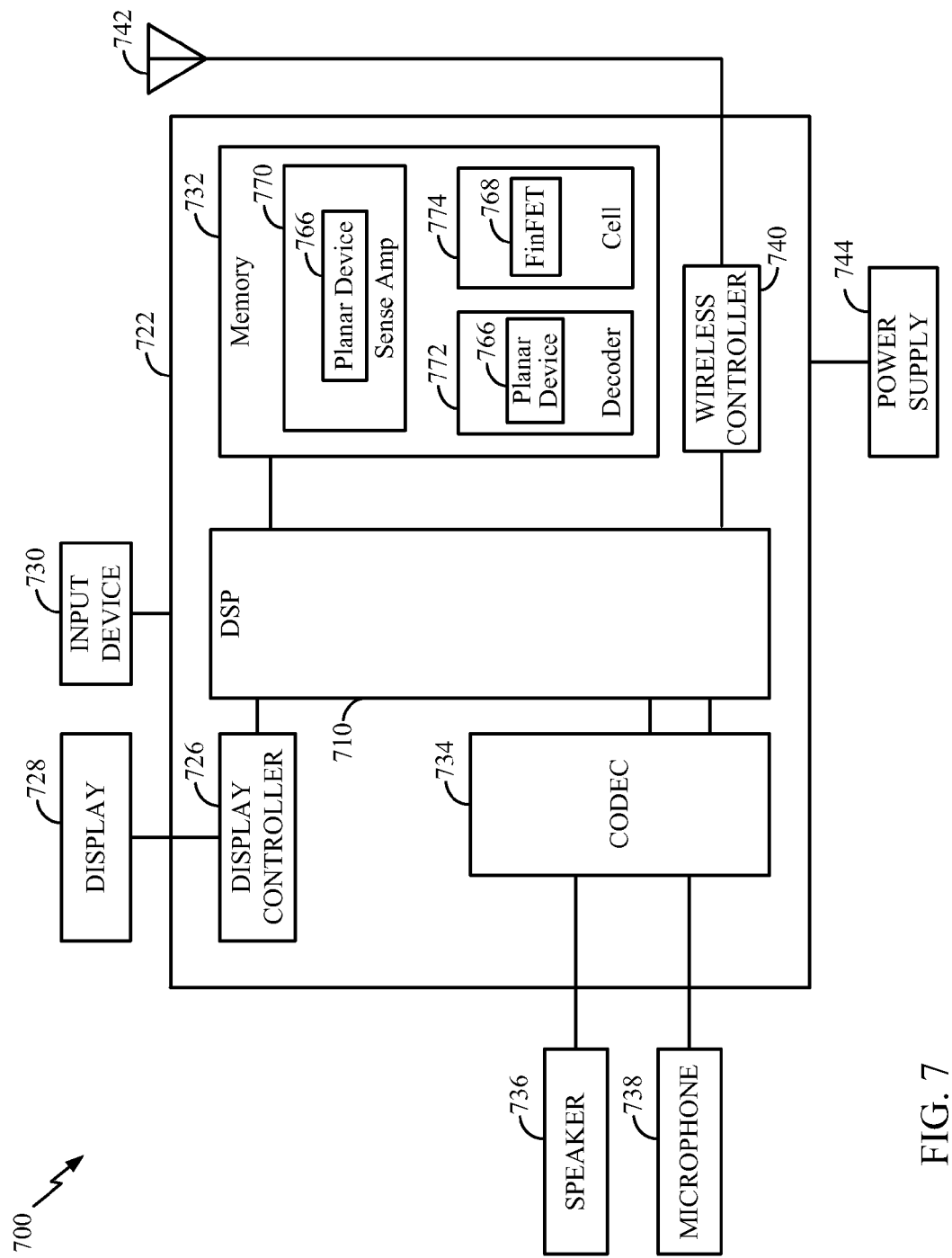
FIG. 7 is a block diagram of a portable device including a FinFET and a planar electronic device on a common substrate.

Referring to FIG. 7, a block diagram of a particular illustrative embodiment of an electronic device, such as a wireless phone, including a FinFET and a planar electronic device on a common substrate formed by an imprint template, as described herein, is depicted and generally designated 700. The device 700 includes a processor, such as a digital signal processor (DSP) 710, coupled to a memory 732 which includes a FinFET device 768 and a planar electronic device 766 on a common substrate formed by an imprint template. In an illustrative embodiment, the memory 732 includes a sense amplifier 770, a decoder 772, and a memory cell 774. In particular embodiments, the planar electronic device 766 may be included within the sense amplifier 770 or the decoder 772 of the memory 732, and the FinFET device 768 may be included within the memory cell 774. In an illustrative example, the FinFET device 768 and the planar electronic device 766 on a common substrate formed by an imprint template includes the FinFET devices and planar electronic device structures depicted in FIG. 5 and have topological features determined using the method of FIG. 6, using the template 110 of FIG. 1 or the template 210 of FIG. 2, or any combination thereof.

FIG. 7 also shows a display controller 726 that is coupled to the digital signal processor 710 and to a display 728. A coder/decoder (CODEC) 734 can also be coupled to the digital signal processor 710. A speaker 736 and a microphone 738 can be coupled to the CODEC 734.

FIG. 7 also indicates that a wireless controller 740 can be coupled to the digital signal processor 710 and to a wireless antenna 742. In a particular embodiment, the DSP 710, the display controller 726, the memory 732, the CODEC 734, the wireless controller 740, and the FinFET 768 and planar electronic device 766 on a common substrate formed by an imprint template are included in a system-in-package or system-on-chip 722. In a particular embodiment, an input device 730 and a power supply 744 are coupled to the on-chip system 722. Moreover, in a particular embodiment, as illustrated in FIG. 7, the display 728, the input device 730, the speaker 736, the microphone 738, the wireless antenna 742, and the power supply 744 are external to the on-chip system 722. However, each can be coupled to a component of the on-chip system 722, such as an interface or a controller.

Those of skill would further appreciate that various illustrative logical blocks, configurations, modules, circuits, and algorithm steps described in connection with the embodiments disclosed herein may be implemented as electronic hardware, computer software executed by a processor, or combinations of both. To clearly illustrate this interchangeability of hardware and software, various illustrative components, blocks, configurations, modules, circuits, and steps have been described above generally in terms of their functionality. Whether such functionality is implemented as hardware or software that is executed by a processor depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus for imprinting a pattern onto an imprintable material deposited on a semiconductor substrate comprising:

a template having an imprint surface:
- a first surface pattern of the template configured to be applied to the imprintable material to shape a first fin field effect transistor (FinFET) device;
- a second surface pattern of the template configured to be applied to the imprintable material to shape a first planar electronic device;
- a third surface pattern of the template configured to be applied to the imprintable material to shape a second planar electronic device; and
- a fourth surface pattern of the template configured to be applied to the imprintable material to shape a second FinFET device,
- wherein the first surface pattern, the second surface pattern, the third surface pattern, and the fourth surface pattern are arranged along a first direction such that the first surface pattern is disposed between the second surface pattern and the third surface pattern and such that the third surface pattern is disposed between the first surface pattern and the fourth surface pattern, and
- wherein the first FinFET device, the second FinFET device, the first planar electronic device, and the second planar electronic device are formed concurrently.

2. The apparatus of claim 1, wherein the second surface pattern is adapted to form a plurality of planar electronic devices.

3. A method of fabricating an electronic device, the method comprising:
- forming a patterned resist layer by applying a template to fluidic resist material supported by a substrate; and
- forming the electronic device using the patterned resist layer by:
  - patterning the substrate to produce a patterned substrate, wherein the patterned substrate has a patterned shape that is defined by the patterned resist layer,
  - wherein the template has an imprint surface that includes:
    - a first surface pattern configured to be applied to the fluidic resist material to shape a first fin field effect transistor (FinFET) device;
    - a second surface pattern configured to be applied to the fluidic resist material to shape a first planar electronic device;
    - a third surface pattern configured to be applied to the fluidic resist material to shape a second planar electronic device; and
    - a fourth surface pattern configured to be applied to the fluidic resist material to shape a second FinFET device,
    - wherein the first surface pattern, the second surface pattern, the third surface pattern, and the fourth surface pattern are arranged along a first direction such that the first surface pattern is disposed between the second surface pattern and the third surface pattern and such that the third surface pattern is disposed between the first surface pattern and the fourth surface pattern,
    - wherein the first FinFET device, the second FinFET device, the first planar electronic device, and the second planar electronic device are formed concurrently, and
    - wherein the first FinFET device, the second FinFET device, the first planar electronic device, and the second planar electronic device are fabricated without applying an additional patterned resist layer to the substrate.

4. The method of claim 3, wherein the patterned substrate includes the first FinFET device corresponding to the first surface pattern and the first planar electronic device corresponding to the second surface pattern, wherein the first surface pattern and the third surface pattern are substantially aligned in a second direction that is perpendicular to the first direction.

5. The method of claim 3, wherein the template is monolithic.

6. The method of claim 3, wherein the first planar electronic device is a metal oxide semiconductor field effect transistor (MOSFET).

7. The method of claim 3, wherein the imprint surface further comprises a lubricant coating.

8. An apparatus for imprinting a pattern onto an imprintable material deposited on a semiconductor substrate comprising:
- means for imprinting a pattern in a fluidic resist material supported by a substrate to produce a patterned resist layer, wherein the means for imprinting includes an imprinting surface comprising:
  - a first surface pattern configured to be applied to the imprintable material to shape a first fin field effect transistor (FinFET) device;
  - a second surface pattern configured to be applied to the imprintable material to shape a first planar electronic device;
  - a third surface pattern configured to be applied to the imprintable material to shape a second planar electronic device; and
  - a fourth surface pattern configured to be applied to the imprintable material to shape a second FinFET device,
  - wherein the first surface pattern, the second surface pattern, the third surface pattern, and the fourth surface pattern are arranged along a first direction such that the first surface pattern is disposed between the second surface pattern and the third surface pattern and such that the third surface pattern is disposed between the first surface pattern and the fourth surface pattern,
  - wherein the first FinFET device, the second FinFET device, the first planar electronic device, and the second planar electronic device are formed concurrently, and
  - wherein the first FinFET device, the second FinFET device, the first planar electronic device, and the second planar electronic device are fabricated without applying an additional patterned resist layer to the substrate;
- means for forming an electronic device using the patterned resist layer to pattern the substrate to produce a patterned substrate, wherein the patterned substrate has a patterned shape that is defined by the patterned resist layer; and
- means for removing the patterned resist layer after patterning the substrate.

9. The apparatus of claim 8, wherein the means for imprinting the pattern comprises a means for imprinting a plurality of sub-patterns, each sub-pattern associated with the corresponding first or second FinFET device.

10. The apparatus of claim 8, wherein the means for imprinting the pattern comprises a means for imprinting a plurality of sub-patterns, each sub-pattern associated with the corresponding first or second planar electronic device.

11. A non-transitory computer readable storage medium storing processor executable instructions that are executable by a processor to:

cause formation of a patterned resist layer by a template being applied to fluidic resist material supported by a substrate; and cause formation of an electronic device using the patterned resist layer by:

cause a patterning of the substrate to produce a patterned substrate, wherein the patterned substrate has a patterned shape that is defined by the patterned resist layer, wherein the template has an imprint surface that includes:

a first surface pattern of the template configured to be applied to the fluidic resist material to shape a first fin field effect transistor (FinFET) device;

a second surface pattern of the template configured to be applied to the fluidic resist material to shape a first planar electronic device;

a third surface pattern of the template configured to be applied to the fluidic resist material to shape a second planar electronic device; and a fourth surface pattern of the template configured to be applied to the fluidic resist material to shape a second FinFET device, wherein the first surface pattern, the second surface pattern, the third surface pattern, and the fourth surface pattern are arranged along a first direction such that the first surface pattern is disposed between the second surface pattern and the third surface pattern and such that the third surface pattern is disposed between the first surface pattern and the fourth surface pattern, wherein the first FinFET device, the second FinFET device, the first planar electronic device, and the second planar electronic device are formed concurrently, and wherein the first FinFET device, the second FinFET device, the first planar electronic device, and the second planar electronic device are fabricated without applying an additional patterned resist layer to the substrate; and after the patterning of the substrate, cause a removal of the patterned resist layer.

12. The non-transitory computer readable storage medium of claim 11, wherein the first surface pattern is adapted to fabricate a plurality of FinFET devices that includes the first FinFET device.

13. The non-transitory computer readable storage medium of claim 11, wherein the second surface pattern is adapted to fabricate a plurality of planar electronic devices.

14. The apparatus of claim 1, wherein the first surface pattern and the third surface pattern are substantially aligned in a second direction that is perpendicular to the first direction.

15. The apparatus of claim 1, wherein the second surface pattern and the fourth surface pattern are substantially aligned in a second direction that is perpendicular to the first direction.

* * * * *